(12) United States Patent
    Paull

(10) Patent No.: US 11,869,996 B2
(45) Date of Patent: Jan. 9, 2024

(54) ENCAPSULATED PHOTOVOLTAIC CELLS

(71) Applicant: Stellaris Corporation, Nashua, NH (US)

(72) Inventor: James B. Paull, Andover, MA (US)

(73) Assignee: STELLARIS CORPORATION, Nashua, NH (US)

( * ) Notice: Subject to any disclaimer, the term of this patent is extended or adjusted under 35 U.S.C. 154(b) by 0 days.

(21) Appl. No.: 17/188,647

(22) Filed: Mar. 1, 2021

(65) Prior Publication Data

US 2021/0273125 A1    Sep. 2, 2021

Related U.S. Application Data

(60) Provisional application No. 62/983,214, filed on Feb. 28, 2020.

(51) Int. Cl.
    *H01L 31/048*    (2014.01)
    *C08L 33/12*    (2006.01)
    *C08L 83/04*    (2006.01)
    *C08L 23/08*    (2006.01)

(52) U.S. Cl.
    CPC .......... *H01L 31/0481* (2013.01); *C08L 33/12* (2013.01); *C08L 23/0853* (2013.01); *C08L 83/04* (2013.01); *C08L 2201/10* (2013.01); *C08L 2203/206* (2013.01)

(58) Field of Classification Search
    CPC ...... Y02E 10/50; C08L 33/12; C08L 2201/10; C08L 2203/206; C08L 23/0853; C08L 83/04; H01L 31/048; H01L 31/0481; C08G 77/80; H02S 20/26
    See application file for complete search history.

(56) References Cited

U.S. PATENT DOCUMENTS

| 4,241,493 A * | 12/1980 | Andrulitis ......... B32B 17/10119 29/841 |
| 2006/0283495 A1* | 12/2006 | Gibson ................. H01L 31/046 136/246 |
| 2007/0137696 A1* | 6/2007 | Krokoszinski ........ H01L 31/055 136/255 |
| 2008/0257403 A1* | 10/2008 | Edmonds .............. H01L 31/048 136/251 |
| 2010/0012187 A1 | 1/2010 | Paull et al. |
| 2010/0307585 A1* | 12/2010 | Keller ............... B32B 17/10761 136/259 |
| 2013/0014808 A1* | 1/2013 | Brounne ............. H01L 31/0481 438/66 |
| 2016/0079448 A1 | 3/2016 | Shao et al. |
| 2017/0363789 A1* | 12/2017 | Stalder .................. G02B 1/118 |

OTHER PUBLICATIONS

International Search Report and Written Opinion dated Mar. 1, 2021 issued in related International Patent Application No. PCT/US2021/20268.

* cited by examiner

*Primary Examiner* — Mayla Gonzalez Ramos
(74) *Attorney, Agent, or Firm* — Grossman, Tucker, Perreault & Pfleger, PLLC

(57) ABSTRACT

A product and a process for encapsulating solar cells in a module using transparent plastics and an optically coupling fluid. A photovoltaic window device of a construction that enables generation of electric power while simultaneously affording transparency.

11 Claims, 5 Drawing Sheets

# ENCAPSULATED PHOTOVOLTAIC CELLS

CROSS-REFERENCE TO RELATED APPLICATIONS

This application claims the benefit of U.S. Provisional Patent Application Ser. No. 62/983,214 filed Feb. 28, 2020.

FIELD OF THE INVENTION

This invention relates to the field of solar photovoltaics, particularly as integrated into building materials.

BACKGROUND OF THE INVENTION

Almost all photovoltaic modules made from crystalline solar cells encapsulate them in a sandwich of glass, transparent adhesive and a polymer back-sheet. The transparent adhesive, typically ethylene vinyl acetate (EVA) is melted and de-gassed at a high temperature in a vacuum lamination chamber, fusing the module components together.

While this standard manufacturing technique has worked well for many years, it may not be well-suited for laminating solar cells into other transparent glazing materials, such as transparent plastics polymethyl methacrylate (PMMA) and polycarbonate. This is especially true if the alternative glazing materials are formed in complex shapes, as it may be much more difficult to apply uniform pressure to join the assembly, eliminate voids, and remove bubbles formed by the out-gassing of the EVA. Unlike glass, plastics can be easily formed and machined into optical components that enable new module forms and functions. This invention provides a method of making photovoltaic modules and a photovoltaic construction of a different form with advantageous performance characteristics.

SUMMARY

A product and a process for encapsulating solar cells in a module using transparent plastics and an optically coupling fluid. A photovoltaic window device of a construction that enables generation of electric power while simultaneously affording transparency.

The plastic comprising a photovoltaic module is formed with relatively narrow cavities, ranging from 0.2 mm to 2.0 mm in width, providing space for solar cells or sections of solar cells. A clear fluid, compatible with the solar cells and the plastic, and having an index of refraction substantially equivalent to the plastic, provides cushioning for the solar cell, allows for differential thermal expansion, and optically couples the solar cell with the plastic encapsulation with a reduction in refractive distortion.

Accordingly, the present invention relates to photovoltaic window pane comprising:
 a transparent sheet of polymeric material having a thickness in the range of 4.0 mm to 12.0 mm wherein said sheet includes a plurality of slots, having a depth of 1.5 mm to 8.0 mm and a width of 0.2 mm to 2.0 mm and wherein said transparent sheet of polymeric material has a refractive index (RI)=a value "X";
 optically coupling fluid positioned in said slots wherein the refractive index of said optical coupling fluid has a value no more than 0.01 units below the value of "X" and no more than 0.2 units above the value of "X".

The present invention also relates to 1 photovoltaic window pane comprising:
 a sheet of poly(methyl methacrylate) having a thickness in the range of 4.0 mm to 12.0 mm wherein said sheet includes a plurality of slots, having a depth of 1.5 mm to 8.0 mm and a width of 0.2 mm to 2.0 mm and a refractive index of 1.49;
 optically coupling fluid positioned in said slots wherein the refractive index of said optical coupling fluid has a value in the range of 1.48 to 1.69.

DETAILED DESCRIPTION

Figure 1:
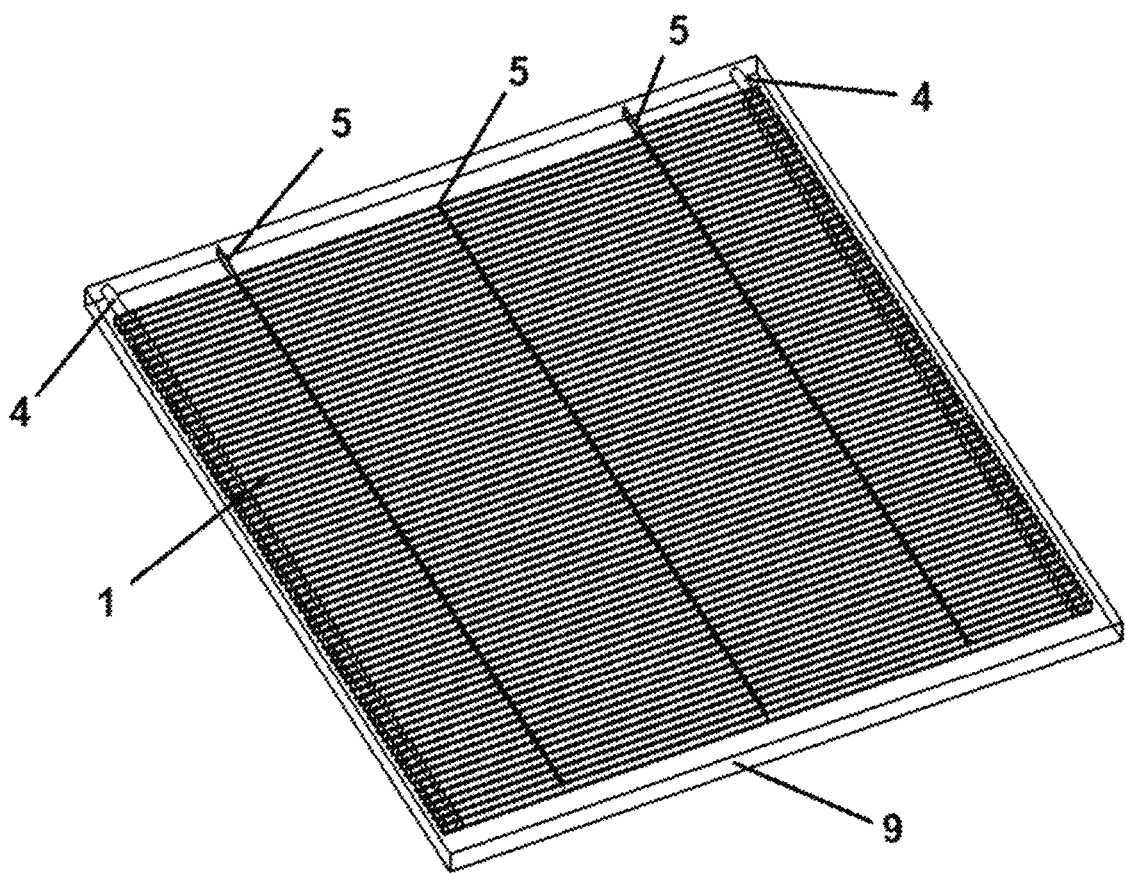
FIG. 1 is a three-dimensional view of an assembled photovoltaic window pane.

The present invention provides a method of encapsulating a photovoltaic solar cell in a module and the module itself. The method can be used to encapsulate cells that have been diced from full-sized cells. The latter is particularly important as smaller cells can be configured in a module in ways different from what can be done with full-sized cells. An example of this is a module that incorporates narrow strips of cells embedded in horizontal layers within a thin glazing, similar to miniature Venetian blinds. A glazing of this type may have the same form as a typical pane or lite in an insulated glass window and be readily incorporated into standard window units.

An advantage of this module configuration is that the horizontal PV cells do not block views in or out of a window, yet higher angle incident sunlight is absorbed by the cells, producing a significant amount of electrical power. By absorbing light incident at higher angles, the PV cell strips also serve to reduce solar heat gain into a building, thereby lowering air conditioning loads.

To make this module configuration, relatively narrow cavities may be formed in a sheet of clear or transparent polymer material such as PMMA or polycarbonate. Reference to transparent polymer material is reference to a material that transmits 90% or more of light at wavelengths between 380 nm and 1000 nm. The narrow cavities are preferably in the form of slots used to contain photovoltaic cells, grooves used to contain the wires interconnecting the cells, and channels that serve as a manifold for filling and distribution of a coupling fluid. A slot is reference to a relatively narrow width aperture that extends into the polymer material for insertion of the PV cells herein. These cavities may be formed by injection molding, extrusion, thermo-forming, sawing or other techniques well known in the plastics industry. One or more channels perpendicular to the narrow slots may also be formed in the plastic to serve as a manifold and filling means for optically coupling fluid. The fluid may fill any voids in the slots or the channels, displacing air and maintaining consistency in refractive index. By optically coupling it is understood to mean the elimination of air in the optical path that would otherwise cause unwanted refraction due to a large change in refractive index in the path of light. The channels may have one or more openings in the top or side edges of the formed plastic sheet for the purpose of filling and displacing air when filling. These openings may be sealed in a number of ways, such as with a screw or an adhesive.

To avoid unwanted refraction, the refractive index of the coupling liquid may be substantially equivalent to that of the encapsulating plastic. The liquid may also be compatible with the plastic and the solar cells with no chemical reactions, electrical conductivity, thermal expansion, or other physical characteristics that could adversely affect the life of the module.

Relatively small grooves may also be formed in the plastic normal to the slots to serve as cavities for bus wires interconnecting the solar cells and exiting the window to join with external circuits.

The narrow PV cells may be electrically interconnected by thin wires soldered or otherwise electrically connected to the positive and negative bus pads on the solar cells. The PV cells may be inserted into the slots formed in the plastic sheet with the interconnecting wires routed through the grooves formed substantially perpendicular to the slots.

The formed plastic sheet with the cells and wires is then covered by a second clear/transparent plastic sheet cover to make a sealed encapsulation. This sheet may be unformed or formed with slots, channels and or grooves that mate with the first sheet. The first and second plastic sheets may be sealed around the edges and at locations interior to the edges by solvent welding or clear adhesives, techniques well known in the art.

In a preferred embodiment of this invention, relatively narrow slots are formed in a relatively thin sheet of clear PMMA. Other transparent polymers can be used as well, such as polycarbonate, PET, or urethane. To be practical, the thickness of the sheet may approximate the thickness of glass commonly used in insulated glass window units (IGUs). Accordingly, the thickness of the relatively thin sheet of transparent polymeric material utilized herein may range from 4.0 mm to 12.0 mm. The width of the sheet may preferably be wide enough to accommodate one or more typical silicon photovoltaic cells of 156 mm. The cells may be placed end-to-end in the slots and may include a space between them that may range from 1 mm to 10 mm to account for thermal expansion. The sheets may be of any width limited only by commercial availability of 5 materials. Cells may be restrained from movement in the slots by the electrical wiring connections between them. A preferred width of the sheet may therefore be from 160 mm to 170 mm. The length of the sheet can vary depending on the application. However, preferably, the length of the sheet may be in the range of 160 mm to 1,250 mm.

The relatively narrow slots may be formed by injection molding, extruding, thermoforming, sawing or other methods of forming or machining plastic known in the art. In the preferred embodiment, the narrow slots and other features are formed by injection molding the sheet. The width of the slots may be somewhat wider than the thickness of the PV cells used in the assembly. Crystalline silicon solar cells 200 microns thick, or 0.2 mm, are used in this embodiment. For these cells, the preferred width of the slot is 300 microns, or 0.3 mm. However, slot widths from 0.2 mm to 2.0 mm may be employed, including widths of 0.25 mm to 1.5 mm.

The depth of the slots may be somewhat larger than the width of the cells, ranging from 1.5 mm to 8 mm. The preferred embodiment employs cells 3 mm wide; however, this width may vary depending on the thickness of the photovoltaic window being constructed. As cells are meant to be inserted into the slots sideways, the width of the cells corresponds to the depth of the slots.

The spacing of the slots in the sheet may be adjusted to achieve the desired transparency and photovoltaic performance. In a vertical window application, slots and their associated photovoltaic cells that are closer together will yield higher photovoltaic output at the expense of window visibility at higher lines of sight. Conversely, slots that are further apart will afford greater visibility at the expense of lower power production. The preferred ratio of cell width to the distance between slots ranges from 0.70 to 1.7.

In addition to the slots, fluid channels may be formed normal to the slots. In this embodiment, two channels are preferably used, each preferably located near the ends of the slots at the sides of the sheet. These channels serve as a manifold for filling and interconnecting the slots with an optical coupling fluid. A second channel may serve as a path for air to escape the assembly when being filled with fluid. In a preferred embodiment, these channels may be of a circular or rectangular cross section, with diameters or side dimensions ranging from 1.0 mm to 4.0 mm.

Yet another feature that may be formed into the sheet are grooves, also formed normal to the slots. These grooves may be used as conduit for wires electrically interconnecting the solar cells. The grooves may be aligned to the bus pads on the photovoltaic cells and may continue through at least one end of the sheet as a means of electrically interconnecting photovoltaic window sections. Preferably, the grooves need only be larger than the wires interconnecting the cells. In a preferred embodiment, the dimensions of the grooves are between 0.2 mm and 1.0 mm wide, and from 1.0 mm to 3.5 mm deep.

The photovoltaic cells may be silicon or thin-film cells on a metallic substrate. Thin film cells may be trimmed to the desired width; silicon cells may be diced by sawing or laser-cut as is known in the art.

Figure 2A:
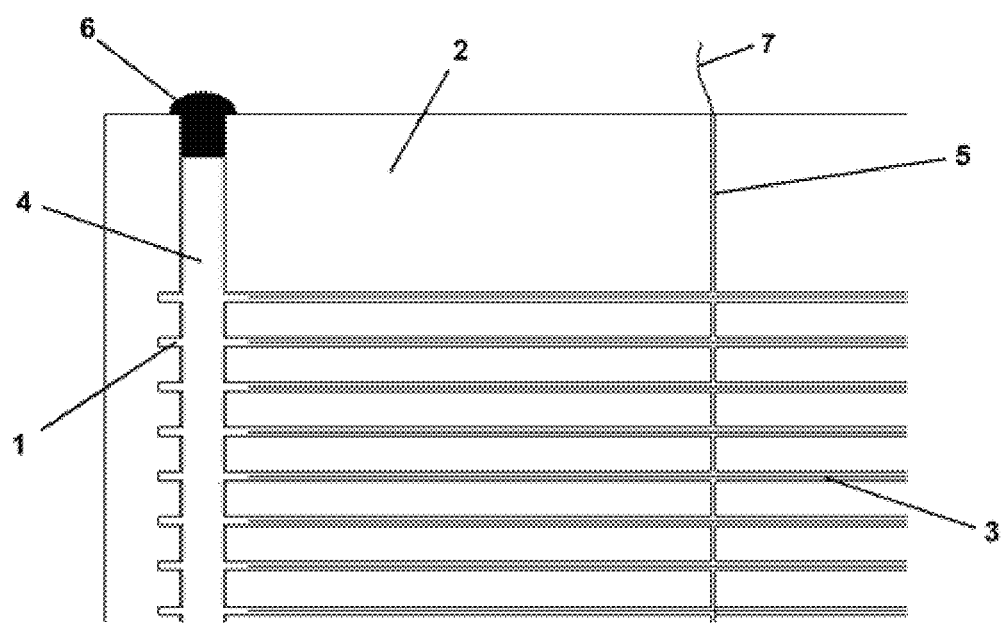
FIG. 2a is a partial horizontal section through an assembled photovoltaic window pane.
Figure 2B:
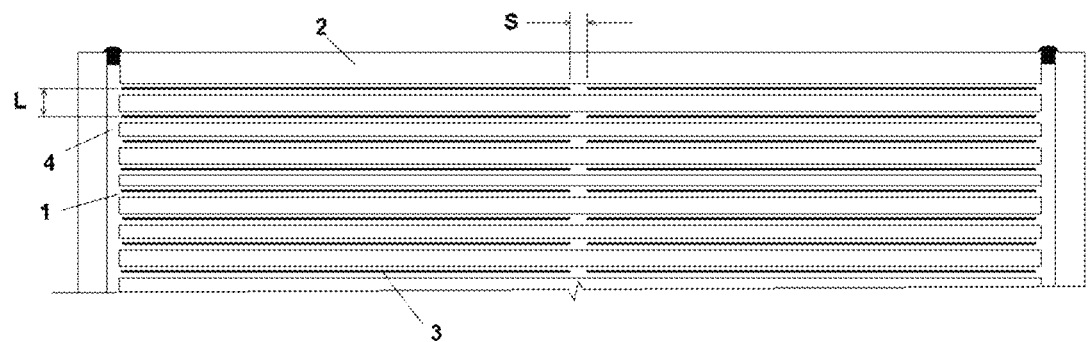
FIG. 2b is a second partial horizontal section through an assembled photovoltaic window pane.

FIG. 1 is a three-dimensional view of the assembled photovoltaic window pane. Slots are shown at 1, the channel at 4 along with grooves at 5. FIG. 2a is a partial top view of the shapes formed in the first sheet 2. The view shows slots 1, channel 4, and grooves 5 formed in the sheet. The slots 1 may each contain PV cells 3. Wires 7 may electrically interconnect PV cells 3 and may be routed through grooves 5, exiting sheet 2 at the edge of the sheet. FIG. 2b is also a partial top view of the shapes formed in the first sheet 2. In addition to showing slots 1, PV cells 3 and channel 4, it defines the center-to-center spacing L of the slots 1 and gap S between multiple PV cells 3. Grooves 5 are not shown in this figure for clarity. The total window pane is identified generally at 9.

Figure 3:
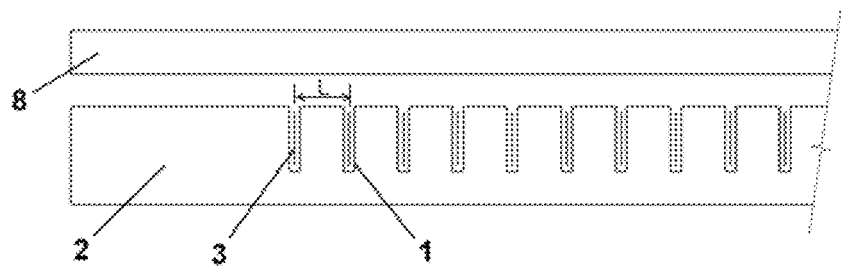
FIG. 3 is a partial vertical section through a first axis of an exploded view of photovoltaic window pane.

Encapsulation of the assembly is preferably effected by covering and sealing the first sheet with a cover 8. The cover 8 may be made from a clear transparent material similar to that of the first sheet at a thickness in the range of 1.0 mm to 5.0 mm. In the preferred embodiment the cover may be of PMMA, also with a thickness from 1.0 mm to 5.0 mm. In addition, one may utilize transparent polyurethane material. The cover may also have slots 1, channels 4 and/or grooves 5 similar to the first sheet. In such an embodiment, the slots, grooves, and channels in each sheet may be shallower than would be necessary if they were formed in only in the first sheet, with the combined depth of the slots, grooves, and channels equaling that if they were only formed in the first sheet. In the preferred embodiment, these slots and channels are only formed in the first sheet. In this embodiment, a flat sheet of the same width and length as the first sheet may cover the first sheet. FIG. 3 is an exploded sectional view of the first sheet 2, PV cell 3, slots 1, and second sheet or cover 8 before assembly. The slots 1 as noted preferably have a depth in the range of 1.5 mm to 8.0 mm and preferably have a width in the range of 0.2 mm to 2.0 mm. The slots are also preferably spaced apart by a distance "L" as shown in FIG. 3 falling in the range of 1.8 mm to 7.0 mm. This distance "L" is the distance on center between the slots. In addition, the slots are such that they preferably run continuously in the sheet 2 and preferably, such slots have a preferred length that will accommodate one or more 156 mm long PV cells and that is 10 mm to 80 mm less than the width of the sheet.

Figure 4A:
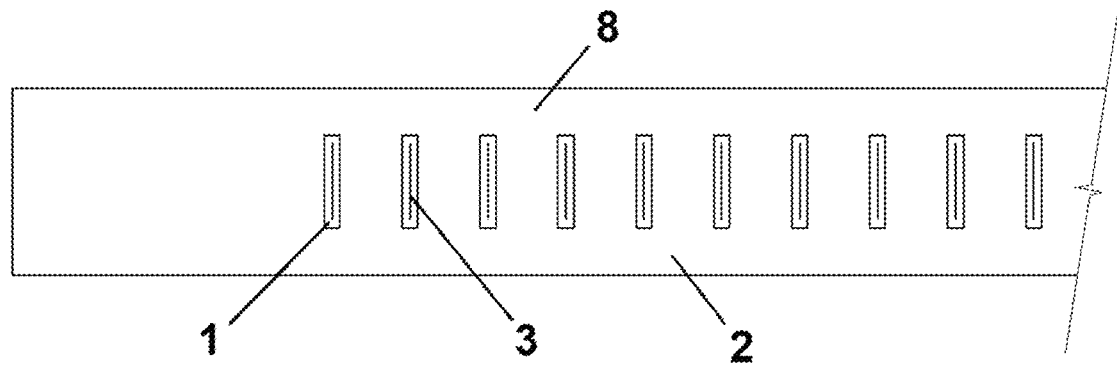
FIG. 4a is a partial vertical section of the assembled photovoltaic window pane of FIG. 3 with formed first sheet and top cover second sheet fused together by solvent welding.
Figure 4B:
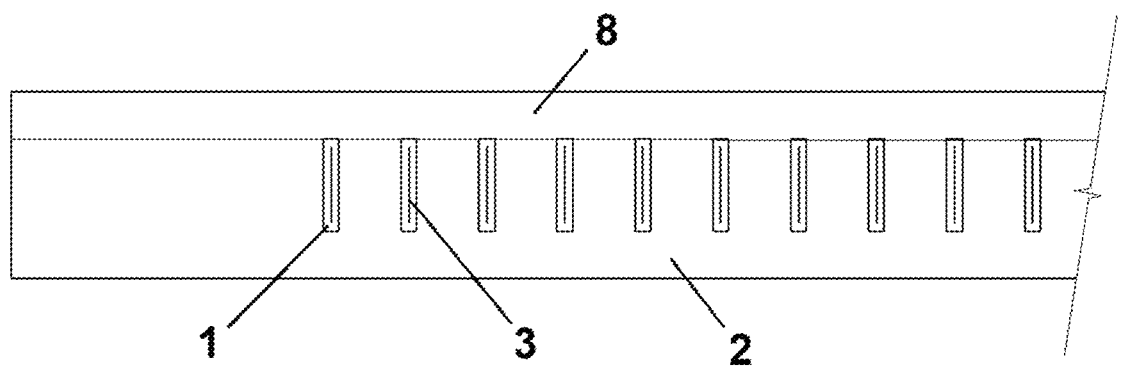
FIG. 4b is a partial vertical section of the assembled photovoltaic window pane of FIG. 3 with formed first sheet and top cover second sheet joined by a clear/transparent adhesive.
Figure 5:
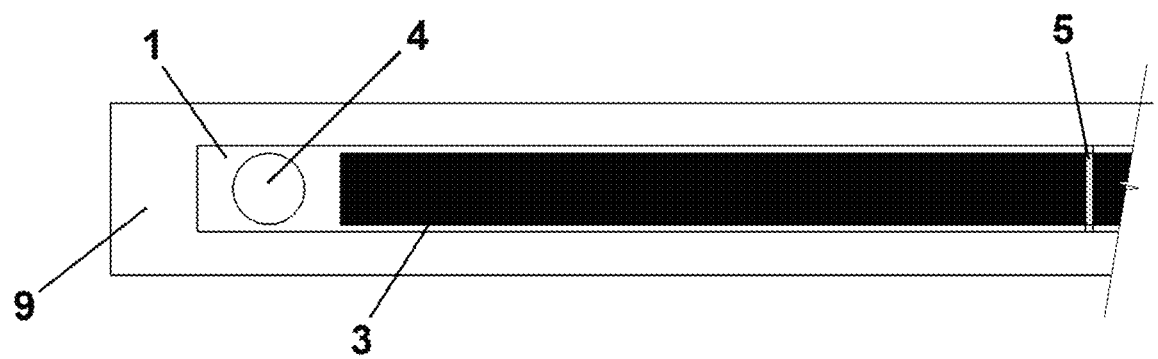
FIG. 5 is a partial vertical section through a second axis of an assembled photovoltaic pane.

The cover may be preferably sealed to the first sheet by solvent welding or by a clear/transparent adhesive. To achieve a sealed encapsulation, all edges of the first sheet and the cover are preferably sealed. In the preferred embodiment, the edges are sealed with an acrylic solvent, such as Weld-on #4. Solvent welding has the advantage such that the PMMA material of the cover and the first sheet fuse together without having any intervening foreign material. Solvent welding connects the molecules of the two parts resulting in a homogeneous cross-section without a boundary. FIG. 4a shows the fused assembly. FIG. 4b shows the assembly if the first sheet and cover are joined with a clear/transparent adhesive where one may then identify a boundary between the first sheet 2 and cover 8. FIG. 5 is a partial vertical section through a second axis of an assembled photovoltaic pane.

One or more interior sections of the cover and the first sheet may also be joined using a similar technique. This internal joining gives mechanical integrity to the assembly that helps ensure dimensional stability and prevents geometric distortion due to hydrostatic pressure from an optically coupling fluid.

After the cover is sealed to the first sheet, the slots 1 and channels 4 are filled with an optically coupling clear fluid. The fluid is chosen to have a refractive index as close as possible to the refractive index of the encapsulating transparent material comprising both the fused cover second sheet 8 and first sheet 2. In other words, when the refractive index (RI) of the first transparent sheet containing the slots is equal to a value "X", the RI of the coupling fluid is selected with a value that is no more than 0.01 units below the value of "X" and no more than 0.2 units above the value of "X".

If the RI of the coupling fluid is more than 0.01 units below the value of the RI of the first transparent sheet, light incident on the first transparent sheet at low angles with respect to the side of the slots formed in the sheet may start to significantly reflect off the interface between the first transparent sheet and the coupling fluid in the slot. This is due to total internal reflection in accordance with Snell's Law of Refraction. This total internal reflection not only will cause optical distortion due to change in direction of the light, but also will reflect light away from the PV cell, resulting in loss of electricity production. Conversely, if the RI of the coupling fluid is greater than that of the first transparent sheet, there will be no total internal reflection at the interface and light will be directed to its intended target, the PV cell in the slot. Consequently, there is greater tolerance for RI of the coupling fluid to be greater than that of the first transparent sheet than there is for it to be less than without causing optical distortion and degrading energy performance.

As the encapsulating material for both the second sheet 8 and first sheet 2 in the preferred embodiment is PMMA with a refraction index of approximately 1.49, in the preferred embodiment the refractive index is similarly selected. Accordingly, in the case of utilizing PMMA for both the cover sheet 8 and first sheet 2, the refractive index of the optically coupling fluid herein falls in the range from 1.48 to 1.69.

Outside of the range of noted above for the optically coupling fluid (no more than 0.01 units below the RI of the transparent sheet and no more than 0.2 units above such value), there will be discontinuities in refractive index along the path of light passing through the assembly that would cause unacceptable optical distortions and affect the ability of sunlight to impinge on the PV cells. The optically coupling fluid also is also preferably compatible with the transparent plastic sheet with regard to corrosiveness, chemical reaction, thermal expansion, and other physical characteristics that could adversely affect the performance and durability of the assembly.

There are a variety of liquids that may be preferably used as optically coupling fluids. Among these are mineral, silicone, and plant oils that provide the optical coupling as noted herein. Mineral oil is reference to a hydrocarbon or alkane based oil, silicon oil includes polysiloxane type fluid, and plant oils include oils derived from plant sources. Liquid ethylene-vinyl acetate (EVA) copolymer with a RI of 1.48 to 1.49, such as the Ateva™ brand manufactured by Celanese Corporation, may also be used in a manner of manufacture described below. The preferred embodiment with regard to the selection of optical coupling fluid herein relies upon Dowsil 550 silicone fluid (a phenyl methyl polysiloxane polymer fluid) manufactured by Dow Corning that has a refractive index of 1.49, matching that of the first sheet herein containing the slots for the optically coupling fluid.

For optical coupling with EVA as the optical coupling fluid, both the EVA fluid and the window assembly may be heated to a temperature above the melting point of EVA fluid and below the softening temperature of PMMA or other transparent plastic. This softening temperature of the PMMA may be in the range of 80 to 100 degrees C. The liquified EVA may then be introduced into the assembly via channels 4 with displaced air vented through other different channels 4 present in the assembled photovoltaic window pane. The venting may be done under atmospheric pressure or with a vacuum assist. The liquified EVA may then solidify upon the cooling of the filled assembly.

The photovoltaic window pane may be finally sealed by closing off the channel 4 openings at the edges of the assembly. Again referring to FIG. 2, channels 4 may be sealed with a screw and gasket 6, with an insert of a material solvent welded or glued into the assembly, or by a compatible adhesive. A compatible adhesive, such as UV-cured adhesive 3099 made by Dymax Corporation, may also be used to seal the grooves 5 containing the wires 7 at the interface of the assembly edge.

In the present embodiment, individual sealed encapsulated assemblies may be joined together to form a larger pane with a higher electrical output. This preferably is accomplished by solvent welding the edges of individual assemblies or alternatively, joining them with a clear adhesive. Electrical interconnections between the individual assemblies may be routed through channels in the edges of the assemblies and sealed with solvent welding, UV-cured adhesives, or other adhesives or fillers commonly used in plastics fabrication

What is claimed is:

1. A photovoltaic window pane comprising:
   a transparent sheet of polymeric material having a thickness in the range of 4.0 mm to 12.0 mm wherein said sheet includes a plurality of slots, having a depth of 1.5 mm to 8.0 mm and a width of 0.2 mm to 2.0 mm and wherein said transparent sheet of polymeric material has a refractive index (RI)=a value "X" and wherein said transparent sheet of polymeric material comprises poly(methyl methacrylate) having a refractive index of 1.49 and said optical coupling fluid has a refractive index of 1.48 to 1.69;
   one or more photovoltaic cells inserted in said plurality of slots; and
   optically coupling fluid positioned in said slots and encapsulating said one or more photovoltaic cells wherein said optically coupling fluid remains in a fluid state and wherein the refractive index of said optical coupling fluid has a value no more than 0.01 units below the value of "X" and no more than 0.2 units above the value of "X" wherein light passing through said optically coupling fluid and contacting said one or more photovoltaic cell generates electrical power and wherein said optically coupling fluid comprises phenyl methyl polysiloxane.

2. The photovoltaic window pane of claim 1 further including a transparent cover sheet sealed to said first sheet wherein the transparent cover sheet has a thickness in the range of 1.0 mm to 5.0 mm.

3. The photovoltaic window pane of claim 1 wherein said plurality of slots run continuously within said transparent sheet of polymeric material and have a length in the range of 157 mm to 200 mm.

4. The photovoltaic window pane of claim 1 wherein said plurality of slots are separated from one another by a distance on center in the range of 1.8 mm to 7.0 mm.

5. The photovoltaic window pane of claim 2 wherein said transparent cover sheet comprises poly(methyl methacrylate) having a refractive index of 1.49.

6. A photovoltaic window pane comprising:
   a sheet of transparent poly(methyl methacrylate) having a thickness in the range of 4.0 mm to 12.0 mm wherein said sheet includes a plurality of slots, having a depth of 1.5 mm to 8.0 mm and a width of 0.2 mm to 2.0 mm and a refractive index of 1.49;
   one or more photovoltaic cells inserted in said plurality of slots; and
   optically coupling fluid positioned in said slots and encapsulating said one or more photovoltaic cells wherein said optically coupling fluid remains in a fluid state and wherein the refractive index of said optical coupling fluid has a value in the range of 1.48 to 1.69" wherein light passing through said optically coupling fluid and contacting said one or more photovoltaic cell generates electrical power;
   wherein said optically coupling fluid comprises phenyl methyl polysiloxane.

7. The photovoltaic window pane of claim 6 further including a poly(methyl methacrylate) cover sheet sealed to said first sheet wherein the poly(methyl methacrylate) cover sheet has a thickness in the range of 1.0 mm to 5.0 mm.

8. The photovoltaic window pane of claim 6 wherein said plurality of slots run continuously within said transparent sheet of poly(methyl methacrylate) material and have a length in the range of 157 mm to 200 mm.

9. The photovoltaic window pane of claim 6 wherein said plurality of slots are separated from one another by a distance on center in the range of 1.8 mm to 7.0 mm.

10. The photovoltaic window pane of claim 1 further including one or more channels in said transparent sheet in fluid communication with said slots, said one or more channels configured to be filled with said optically coupling fluid to then fill said slots.

11. The photovoltaic window pane of claim 6 further including one or more channels in said transparent sheet of poly(methyl methacrylate) in fluid communication with said slots, said one or more channels configured to be filled with said optically coupling fluid to then fill said slots.

* * * * *